Figure 1:
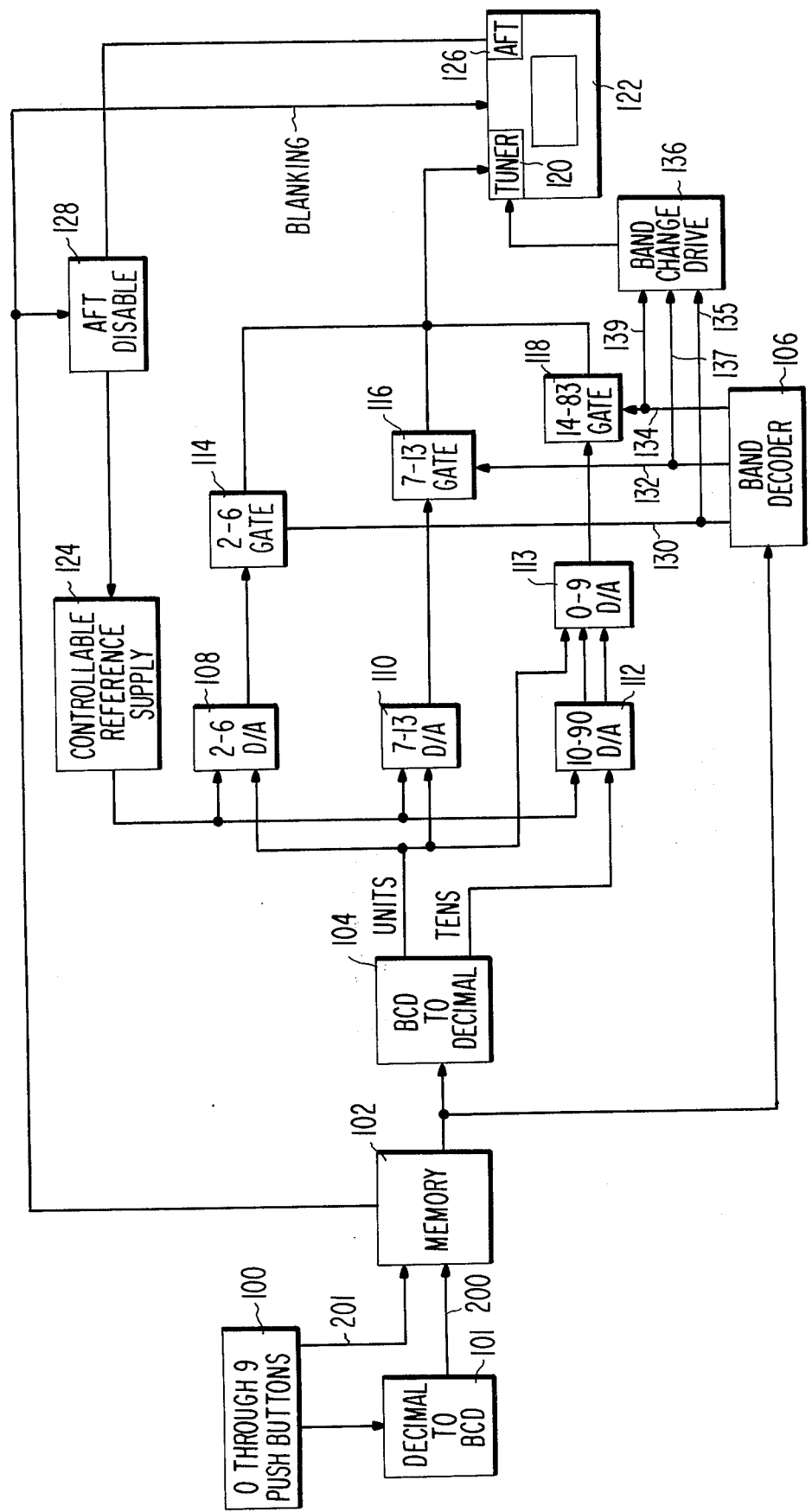

United States Patent [19]
Christensen

[11] 3,947,773
[45] Mar. 30, 1976

[54] CHANNEL NUMBER MEMORY FOR TELEVISION TUNERS

[75] Inventor: Don Edward Christensen, Indianapolis, Ind.

[73] Assignee: RCA Corporation, New York, N.Y.

[22] Filed: Jan. 17, 1974

[21] Appl. No.: 434,282

[52] U.S. Cl. ............................... 325/464; 325/459
[51] Int. Cl.² ............................................. H04B 1/06
[58] Field of Search ............ 325/464, 465, 468–470, 325/455, 457, 459, 462; 334/14–16, 18, 26; 235/92 EA; 340/365 E, 365 S, 365 R

[56] References Cited
UNITED STATES PATENTS

| | | | |
|---|---|---|---|
| 3,636,319 | 1/1972 | Nixon | 235/92 EA |
| 3,681,574 | 8/1972 | Caulkin | 340/365 S |
| 3,748,645 | 7/1973 | Kawashima | 325/465 |

*Primary Examiner*—Albert J. Mayer
*Attorney, Agent, or Firm*—E. M. Whitacre; P. M. Emanuel

[57] ABSTRACT

A voltage controlled tuner in a television receiver is tuned to a desired television channel by sequentially selecting first and second digits representative of a desired channel number. The digits are stored in first and second memory registers from which corresponding analog tuning voltages are developed. Noise immunity circuitry coupled to the memory registers assures accurate registration of the channel digits in the memory registers by minimizing effects of contact bounce and other extraneous noise signals.

10 Claims, 2 Drawing Figures

CHANNEL NUMBER MEMORY FOR TELEVISION TUNERS

This invention relates to tuning systems for television receivers and more particularly to a system for accurately storing electrical signals representative of a selected channel number in memory registers.

In many of the more populated areas of the world, television receivers are designed to receive signals in a significant number of television channels. In a television receiver, for example, of the type used in the United States, there are 82 available television channels. It is desirable to be able to select any one of these channels with equal ease, that is, to have a tuning system in which each channel may be addressed by the same process. In one type of channel selection system which provides parity of channel address, a series of ten push buttons, or similar input devices, numerically representing digits 0 through 9, is incorporated for selecting a desired channel. Channel selection is then effected by sequentially depressing the push buttons representing the desired channel number. A first push button depression represents the tens digit of the channel number, for example, 0 if the desired channel number is 2 through 9, and 1 through 8 if the desired channel number is 10 through 83. A second push button depression represents the units digit of the desired channel number. The two selected digits are entered into storage (memory) registers wherein a numerical value is utilized to operate circuitry within the television receiver to place the tuner at the desired channel frequency. One particular problem that arises from the use of devices such as push button switches is that generally, upon depression, contact bounce or a similar repetitive input condition results. This "contact bounce" may be detrimental in that erroneous signals may be formed, falsely supplying information to the storage registers. Further, noise signals developed in the television receiver and surrounding areas may further act to provide erroneous signals to the registers unless the registers are only conditioned for entry of channel information when such information is present. It is, therefore, desirable to provide a digital memory system that incorporates means for eliminating erroneous signals from contact bounce or similar disturbances and minimizing signal errors due to the presence of extraneous signals.

In accordance with the present invention, a television receiver having means for providing electrical signals representative of a channel number incorporates a system for accurately storing these electrical signals with a high degree of reliability. The system for storing electrical signals comprises input means for receiving digital signals representative of individual digits of a television channel number. Detecting means are coupled to the storing means for determining the presence of digital signals. Delay means are coupled to the detecting means for providing a control at a predetermined time interval after detection of the presence of the digital signals. A switching means is coupled to the delay means for providing alternate first and second output signals and is responsive to successive ones of the control signals. A first and second register means having respective input terminals coupled to the input means and respective storage enabling terminals coupled to the switching means is operative to respectively store first and second digit-representative signals supplied by the input means in respective first and second registers in response to signals from the switching means.

Figure 2:
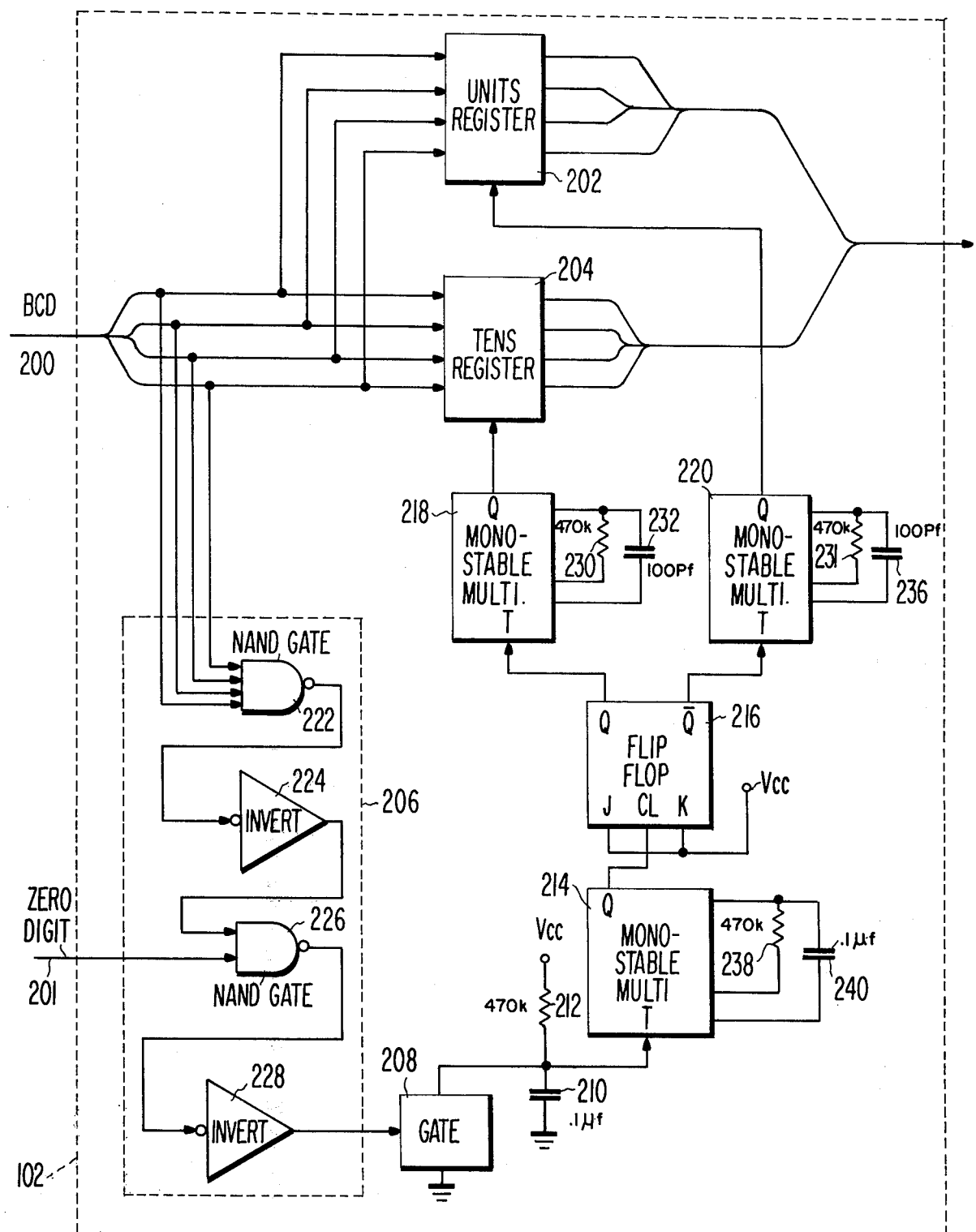

The various aspects of the invention will be described below in greater detail referring to the accompanying drawing, in which:

FIG. 1 is a block diagram of a channel selection system incorporating the invention; and FIG. 2 is a detailed block diagram of the memory apparatus illustrated in FIG. 1.

With reference to FIG. 1, an assembly including ten touch or push button switches 100 (labelled 0 through 9) has buttons one through nine coupled to a decimal to binary-coded decimal (BCD) converter 101. The push button assembly 100 may be of a type commonly employed in small electronic calculators. The output of converter 101 is coupled to a memory 102 wherein numerical-representative electrical signals are stored. A separate line 201 from assembly 100 couples a zero digit output directly to memory 102.

Memory 102 is coupled to a BCD to decimal decoder 104 and also to a tuning band decoder 106. A numerical display (not shown) may also be coupled to memory 102 for providing a display of the selected television channel number. Three digital to analog (D/A) converters 108, 110 and 113 are coupled to a units output of decoder 104. A fourth D/A converter 112 is coupled to a tens output of decoder 104. Transfer gates 114, 116 and 118 are coupled to the respective outputs of digital to analog (D/A) converters 108, 110 and 113. The output terminals of transfer gates 114, 116 and 118 are coupled in common to a voltage controlled tuner 120 associated with a television receiver 122. Tuner 120 may include separate UHF and VHF tuner portions such as the RCA model KRK-194 UHF tuner and the RCA KRK-155 VHF tuner which are shown in RCA Television Service Data, File 1973, No. C-10, published by RCA Corporation, Indianapolis, Ind. Each of the above-named tuners utilizes varactor tuning elements to control tuner frequency but it should be recognized that other types of voltage controlled tuners may be used as well.

Band decoder 106 has three output lines 130, 132 and 134 respectively coupled to control terminals of transfer gates 114, 116 and 118 and to input terminals on band change drive circuit 136. Drive circuit 136 is coupled to tuner 120 and provides voltage levels to switch frequency bands in tuner 120 as is set forth, for example, in the above-referenced Service Data.

A controllable source of reference voltage 124 is coupled to D/A converters 108, 110 and 112 and provides a voltage level from which analog tuning voltages are derived. An automatic fine tuning (AFT) circuit 126, for example, of the type shown in the above-referenced Service Data, is located within television receiver 122 and is coupled to the controllable reference source 124 through an AFT disable circuit 128. AFT circuit 126 provides a variable correction voltage for modifying the output voltage supplied by the source of reference voltage 124.

A blanking output from memory 102 is coupled to receiver 122 and to AFT disable circuit 128 for inhibiting operation of such circuits as AFT, sound and video whenever the channel changing or selection process is in progress.

In the operation of the system shown in FIG. 1, one of the buttons of assembly 100, representative of the tens digit of the desired television channel, is depressed by the viewer. Although assembly 100 is referred to as having push button switches, other type devices which provide contact closure or electrical circuit closure may be used. If the desired channel is any one of channels 2 through 9, the zero (0) button is depressed. If the desired channel is any one of those in the range of channels 10 through 83, a corresponding tens digit of 1 through 8 is depressed. Depression of one of the buttons of assembly 100 produces a signal either on one of nine lines (shown diagrammatically as a single line) at the output of assembly 100, which signal is coupled to decimal to BCD converter 101, or, if the digit is zero, on the tenth line 201 which is coupled directly to memory 102. Converter 101 converts the signal derived from button assembly 100 into a binary coded decimal (BCD) number and transfers it via four lines (shown as a single line 200) to a tens register in memory 102 (details of which will be explained later with reference to FIG. 2). Upon entry of a first digit of the two digit channel command into memory 102, a blanking signal is supplied from memory 102. This blanking signal operates to blank the displayed image, mute the sound of television receiver 122 and disable the output of AFT signals from AFT circuit 126. AFT signals are disabled during channel change to allow channel change without any effect by the AFT signals.

To complete the channel selection command, a units digit 0 through 9 is selected. The selected button of assembly 100 is depressed, providing a signal on the appropriate one of the ten associated ouptut lines. As before, if the number is any of the numbers one through nine, converter 101 converts the signal from button assembly 100 to a BCD number and memory 102 stores this number in an associated units register. A zero is coupled directly to memory 102. Upon receiving this second (units) digit command, memory 102 ceases providing the blanking signal to television receiver 122, restoring sound and video and inactivating AFT disabling circuitry 128.

Eight output lines (shown as a single line) representing the tens and units digits of the channel information stored in binary coded decimal form in memory 102 are coupled to BCD to decimal decoder 104 and to band decoder 106. Band decoder 106 decodes the BCD numbers supplied from memory 102 and provides output signals on one of, for example, three output lines to indicate in which of three bands the selected channel lies. For example, channels 2 through 6 may be considered to be in band 1, channels 7 through 13 may be in band 2 and channels 14 through 83 may be in band 3. Additional output lines and decoding circuitry may be added to decoder 106 for providing output signals corresponding to other bands, for example, channels 84 through 89 and 90 through 99, which may then correspond to channels used for other functions such as cable television. Output lines 130, 132 and 134 from band decoder 106 are respectively coupled to the control terminals of transfer gates 114, 116 and 118 and provide signals to selectively operate one of these gates in response to a channel command. Gates 114, 116 and 118 operate to pass a selected one of the simultaneously derived analog tuning voltages developed respectively by D/A converters 108, 110 and 113 to tuner 120.

BCD to decimal decoder 104 decodes the information supplied on eight BCD lines provided by memory 102 into information supplied on 20 lines (shown diagrammatically as two lines labelled "units" and "tens"), the first ten of which correspond to a tens digit and the second ten of which correspond to a units digit. The unit lines of decoder 104 are coupled to D/A converters 108, 110 and 113 and provide a numerical representative signal which is to be converted into an analog voltage. Similarly, the tens lines from decoder 104 are coupled to D/A converter 112, providing the tens digit signal to be converted into an appropriate analog voltage. It is not necessary to provide a tens line to converter 110 since the channel numbers in the range of 7 to 13 can be uniquely selected with an appropriate units digit and the necessary band selection signal (e.g., channel 7 may be represented by the digit seven, while channel 13 may be represented uniquely by its units digit 3. The analog voltages derived from D/A converters 108 and 110 correspond, respectively, to the tuning voltages required to tune tuner 120 to channels 2 through 6 and 7 through 13. In tuning tuner 120 to channels 14 through 83, however, two D/A converters are utilized in order to derive the requisite tuning voltages. D/A converter 112 is responsive to the tens digit portion of the channel command and provides two voltage outputs which correspond to the end channels of a tuning range of eleven channels, i.e., 10–20, 20–30, etc. The voltage range provided by converter 112 is further subdivided by converter 113 into voltages corresponding to individual ones of the channels within the selected eleven channel tuning range. Converter 113 is further responsive to the units digit portion of the channel command and provides a single tuning voltage at its output corresponding to the selected channel in the particular tuning range (e.g., 14 through 83).

In order to provide the requisite analog tuning voltages, D/A converters 108, 110 and 112 receive a reference voltage from reference source 124. Reference source 124 contains a relatively constant voltage supply. In addition, reference source 124 is arranged such that its output voltage is modulated by the automatic fine tuning voltage (AFT) developed in television receiver 122. AFT voltage developed in television receiver 122 is responsive to the deviation in frequency between the received television signal carrier wave and the frequency which the television receiver is tuned to receive. Typically, this frequency deviation is sensed in terms of a difference between the frequency of the converted intermediate frequency carrier and a fixed tuned circuit. The resulting AFT correction voltage is coupled to and operates to change the voltage coupled from reference supply 124 to the D/A converters 108, 110 and 112. The voltage provided by reference supply 124 varies in response to the AFT voltage to change the tuning voltage to tuner 120 and thereby minimize the frequency error between the desired received signal and the operating condition of the tuner.

FIG. 2 illustrates a more detailed representation of memory 102. Signal input means shown as a single input line 200 in FIG. 1 but which is actually four lines as shown in FIG. 2 receives the BCD signals from converter 101 (see FIG. 1) and couples these signals in parallel to a units register 202, a tens register 204 and an OR gate circuit 206, the latter serving as a means for detecting the presence of the digital signals. BCD signals provided by converter 101 are inverted in polarity with respect to normal coding. That is, for a particular BCD number, logical zeros are provided instead of logical ones and vice versa. Correspondingly, a logical zero is provided upon depression of an individual push button of assembly 100. A single input line 201 couples the zero digit output (a logical zero) from push button assembly 100 to OR gate circuit 206 (enclosed in the dashed outline). OR gate 206 is comprised of two NAND gates and two inverters. A first NAND gate 222 has four inputs for receiving BCD signals from line 200 and an output coupled to a first inverter 224. Inverter 224 is coupled to an input of a second NAND gate 226. A second input of gate 226 is coupled to line 201 for receiving zero digit signals. An output of gate 226 is coupled to an input of inverter 228. An output of inverter 228 provides the output signals of OR gate circuit 206. The output of OR gate 206 is coupled to a delay means including a gate 208 which is coupled across a capacitor 210. Gate 208 operates to maintain capacitor 210 discharged in the absence of enabling signals. Capacitor 210 also is coupled to a source of supply voltage ($+V_{cc}$) through a resistor 212. An input terminal of a pulse forming means comprising a monostable multivibrator 214 is coupled to the junction of resistor 212 and capacitor 210. A timing circuit comprising resistor 238 and capacitor 240 is associated with multivibrator 214. Output signals provided by monostable multivibrator 214 are coupled to a clock terminal (CL) of a flip-flop (bistable circuit) 216 and provide signals for changing the output state of flip-flop 216. Flip-flop 216 forms a part of a switching means which is responsive to successive control signals from monostable circuit 214 for providing alternate first and second output signals. That is, flip-flop provides complementary, bilevel output signals on Q and Q̄ output terminals. A second monostable multivibrator 218 is coupled to the Q terminal of flip-flop 216 and receives enabling signals from flip-flop 216. A resistor 230 and a capacitor 232 provide the necessary time constant for multivibrator 218. Similarly, a third monostable multivibrator 220 having a timing circuit comprised of resistor 234 and capacitor 236 receives enabling signals from the Q̄ terminal of flip-flop 216. An output terminal of monostable multivibrator 218 is coupled to a storage-enabling input terminal (S) of tens register 204 for allowing storage of the BCD signal on line 200. Units register 202 has a storage-enabling input coupled to monostable multivibrator 220 for enabling storage of the signals applied to input 200. The above-described circuitry is comprised of C-MOS logic components but other type logic components such as TTL or DTL may work equally as well.

Upon application of a first decimal digit of a channel change command from push button assembly 100, a BCD signal indicative of this portion (the tens portion) of the command is applied to input line 200 or, in the case of a zero digit, to input line 201. Signals applied to line 200 are coupled to input terminals of NAND gate 222. An input signal (logical zero) coupled to NAND gate 222 causes the output of this gate to provide a logical one. This logical one is changed to a logical zero at the output of inverter 224 and applied to an input of NAND gate 226. In response to a logical zero at one of its input terminals, NAND gate 226 provides a logical one. This logical one is inverted in inverter 228 and a logical zero is provided at the output and, consequently, at the output of OR gate circuit 206. Similarly, when a logical zero is applied to line 201, a logical zero is provided at the output of OR gate circuit 206. The logical zero provided at the output of OR gate circuit 206 and responsive to this first portion of a channel change command causes gate 208 to open. In the absence of signals, gate 208 is closed shorting capacitor 210 to ground. When gate 208 is opened, capacitor 210 begins to charge through resistor 212 towards the $+V_{cc}$ supply voltage. Upon capacitor 210 reaching a predetermined voltage, for example $V_{cc}/2$, monostable multivibrator 214 triggers, creating a pulse of about 50 milliseconds duration at its output which, in turn, triggers flip-flop 216. The 50 millisecond pulse duration is facilitated by the time constant of resistor 238 and capacitor 240 associated with multivibrator 214. Flip-flop 216 is arranged such that upon turn-on of television receiver 122, the Q output of flip-flop 216 is caused to assume a low state (logical zero) and the Q̄ output to assume a high state (logical one). Subsequent channel change commands, as will be shown below, provide a sequence of two triggering signals to flip-flop 216 thereby causing the Q output to sequence through a high state and a low state. The Q output of flip-flop 216 therefore remains in a low state after each complete (two digit) channel change command. The triggering pulse provided by multivibrator 214 and responsive to a first decimal digit (i.e., tens command) causes the Q output of flip-flop 216 to change from a low state to a high state and in turn trigger monostable multivibrator 218. The output pulse from monostable multivibrator 218 is of a relatively narrow width of about 300 microseconds and is of sufficient duration to allow the BCD signals on input line 200 to be accurately stored in register 204 while being short enough to prevent erroneous data from entering register 204 when a button of assembly 100 is rapidly depressed and released. Release of the depressed push button of assembly 100, eliminates signals to OR gate 206, consequently causing gate 208 to close and rapidly discharge capacitor 210. The succession of delays and momentary pulses noted above, have been utilized for minimizing errors due to contact bounce, extraneous noise signals and, as noted above, erroneous signals created upon rapid depression and release of push buttons 100.

Upon depression of a second digit of the push button assembly 100, a signal corresponding to the units portion of the desired channel number is applied to input line 200 or in the case of a zero digit, to input line 201. OR gate 206 once again provides a signal (logical zero) to gate 208, opening this gate and allowing capacitor 210 to charge towards the $+V_{cc}$ supply voltage. When the voltage level of capacitor 210 reaches a predetermined level (about $V_{cc}/2$), monostable multivibrator 214 is triggered, producing an output pulse. The output pulse from multivibrator 214 toggles flip-flop 216 such that the Q output now becomes high. A high output from Q triggers monostable multivibrator 220. The output pulse from multivibrator 220, formed with the aid of capacitor 236 and resistor 234, is similar to that provided by multivibrator 218 and operates to allow storage of the BCD information on input line 200 in units register 202. The Q output on flip-flop 216 remains high after completion of the channel selection command and is used to render AFT disable circuit 128 ineffective, thereby unblanking the video and sound in television receiver 122 as mentioned above in connection with FIG. 1.

Hence, first and second digits of a channel number may be stored with a relatively high degree of accuracy while providing additional signals to blank the television receiver during the channel change operation. Signals stored in registers 202 and 204 may be read out in parallel allowing immediate access to the stored information.

What is claimed is:

1. In a television receiver having means for providing digital signals representative of a channel number, a system for storing said channel number comprising:

input means for receiving digital signals representative of individual digits of a television channel number;

means coupled to said input means for detecting the presence of said digital signals;

delay means coupled to said detecting means for providing a control signal at a predetermined time interval after detection of the presence of said digital signals;

switching means coupled to said delay means and responsive to successive ones of said control signals for providing alternate first and second output signals; and first and second register means, each having input terminals coupled to said input means and each having storage enabling terminals coupled to said switching means, said first register being responsive to said first output signal and said second register being responsive to said second output signal for storing, respectively, first and second digit-representative signals supplied by said input means.

2. Apparatus according to claim 1 wherein said delay means comprises:

a source of voltage;

a resistor element coupled to said source;

a capacitor coupled to said source through said resistor element for receiving a charging current from said source;

discharge means coupled across said capacitor for maintaining said capacitor discharged in the absence of signals from said detecting means; and pulse forming means coupled to said capacitor for providing said control signal when the voltage across said capacitor reaches a predetermined level.

3. Apparatus according to claim 2 wherein said discharge means is coupled to said detecting means for receiving therefrom signals responsive to the presence of digital signals representative of a channel number at said input means.

4. Apparatus according to claim 3 wherein said switching means is arranged for providing an output signal at said second output terminal upon initial energization.

5. Apparatus according to claim 4 wherein said switching means comprises a bistable switch having first and second output terminals for providing bilevel complementary output signals and an input terminal for receiving said control signal to alternately switch the signal level on said output terminals.

6. Apparatus according to claim 5 wherein said switching means further comprises second and third pulse forming means having respective input terminals coupled to first and second output terminals of said bistable means and having respective first and second output terminals coupled to respective storage enabling terminals of said first and second registers for providing storage enabling signals of predetermined width to said registers in response to signals from said bistable switch.

7. The apparatus of claim 6 wherein said first and second register means comprises first and second digital registers each having parallel entry input terminals for receiving binary coded digits and output terminals from which said digits may be read in parallel.

8. Apparatus according to claim 7 wherein said means for detecting the presence of digital signals comprises gating means having input terminals for receiving said digital signals and an output terminal for providing signals responsive to the presence of said digital signals.

9. In a television receiver having means for providing digital signals representative of a channel number, a system for storing said channel number comprising:

input means for receiving digital signals representative of individual digits of a television channel number;

means for detecting the presence of said digital signals;

integrating means coupled to said means for detecting for providing output signals having amplitude responsive to the duration of said digital signals;

a first pulse forming means responsive to a predetermined level of said output signal for providing a delayed trigger signal of predetermined width;

bistable means having first and second output terminals and an input trigger terminal for providing alternate complementary signals at said output terminals in response to said trigger signal;

second and third pulse forming means respectively coupled to said first and second output terminals of said bistable means for providing pulses of predetermined width in response to signals from said bistable means; and first and second register means having respective input terminals coupled to said input means and storage enabling terminals respectively coupled to said second and third pulse forming means for respectively storing a first digit representative signal in said first register and a second digit representative signal in said second register in response to signals from said second and third pulse forming means.

10. Apparatus according to claim 9 wherein said integrating means comprises:

a source of voltage;

a resistor element coupled to said source;

a capacitor element coupled to said source through said resistor element for receiving a charging current from said source; and discharge means responsive to signals from said detecting means and coupled across said capacitor for maintaining said capacitor discharged in the absence of said digital signals.

* * * * *

UNITED STATES PATENT OFFICE
CERTIFICATE OF CORRECTION

PATENT NO. : 3,947,773
DATED : March 30, 1976
INVENTOR(S) : DON EDWARD CHRISTENSEN It is certified that error appears in the above-identified patent and that said Letters Patent are hereby corrected as shown below:

```
Column 4, line 14, after "3." insert a parenthesis ")".
Column 5, line 30, after "and" change "Q" to -- Q̄ --
         line 38, after "the" change "Q" to -- Q̄ --.
Column 6, line 12, after "the" change "Q" to -- Q̄ --
         line 50, after "the" change "Q" to -- Q̄ --
         line 51, after "from" change "Q" to -- Q̄ --
         line 56, after "The" change "Q" to -- Q̄ --.
```

Signed and Sealed this eighth Day of June 1976

[SEAL]

Attest:

RUTH C. MASON
*Attesting Officer*

C. MARSHALL DANN
*Commissioner of Patents and Trademarks*